United States Patent [19]
Johnson

[11] Patent Number: 6,023,162
[45] Date of Patent: Feb. 8, 2000

[54] THREE-DIMENSIONAL MORPHOLOGY BY MAGNETIC RESONANCE IMAGING

[75] Inventor: G. Allan Johnson, Chapel Hill, N.C.

[73] Assignee: Duke University, Durham, N.C.

[21] Appl. No.: 09/358,424

[22] Filed: Jul. 22, 1999

Related U.S. Application Data

[60] Provisional application No. 60/093,802, Jul. 23, 1998.
[51] Int. Cl.[7] ....................................................... G01V 3/00
[52] U.S. Cl. .......................... 324/300; 324/309; 324/303; 600/587; 600/561
[58] Field of Search ....................................... 324/300, 309, 324/307, 306; 600/587, 561, 437, 439, 453, 410, 411

[56] References Cited

U.S. PATENT DOCUMENTS

| | | | |
|---|---|---|---|
| 5,417,213 | 5/1995 | Prince | 128/653.3 |
| 5,525,324 | 6/1996 | Block | 424/9.3 |
| 5,545,396 | 8/1996 | Albert et al. | 424/93 |
| 5,716,598 | 2/1998 | Golman et al. | 424/9.36 |

*Primary Examiner*—Christine K. Oda
*Assistant Examiner*—Brij B. Shrivastav
*Attorney, Agent, or Firm*—Nixon & Vanderhye P.C.

[57] ABSTRACT

Methods and systems obtain three-dimensional images of object morphology using nuclear magnetic resonance imaging. Most preferably, an object is immersed in a volume of imaging fluid. An image is then generated by nuclear magnetic resonance imaging representative of a spatial distribution of the imaging fluid. The three-dimensional image sequences that are obtained thus represent a contoured outline of the image fluid which conforms to the morphology of the object being imaged. These three-dimensional image sequences are then processed to produce a digital array of the object which may be displayed.

16 Claims, 2 Drawing Sheets

THREE-DIMENSIONAL MORPHOLOGY BY MAGNETIC RESONANCE IMAGING

This application claims the benefit of U.S. Provisional Application Ser. No. 60/093,802, filed Jul. 23, 1998. +gi

GOVERNMENT RIGHTS STATEMENT

This invention was made with Government support under Grant No. 5P41 RR05959 09 awarded by the national Institutes of Health. The Government has certain rights in the invention.

FIELD OF THE INVENTION

The present invention relates generally to the field of magnetic resonance imaging (MRI). In preferred forms, the present invention is embodied in techniques whereby object morphology may be determined non-destructively by MRI.

BACKGROUND AND SUMMARY OF THE INVENTION

Nuclear magnetic resonance (NMR) imaging is employed in a number of end-use applications so as to provide images of internal structures that may be employed for a variety of diagnostic and/or investigative purposes. For example, magnetic resonance imaging (MRI) is employed in the medical field as a means to assist physicians in diagnosing diseases and other ailments. Conventional MRI, in a clinical setting, generates a signal from fluids, mostly water, in the tissues.

MRI would be a highly desirable technique for industrial applications which require nondestructive structural testing and/or analysis. Presently, however, there are no known techniques which would permit objects of interest to be imaged using MRI in such a manner that would enable three-dimensional images to be constructed of external and/or internal morphologies. It is toward providing such techniques that the present invention is directed.

Broadly, the present invention relates to methods and systems whereby three-dimensional images of object morphology may be obtained using nuclear magnetic resonance imaging. More specifically, the present invention contemplates immersing an object in a volume of imaging fluid, and then conducting magnetic resonance imaging or microscopy of the fluid. Three-dimensional image sequences are obtained that represent an outline of the image fluid which conforms to the morphology of the object. These three-dimensional image sequences are then processed to produce a digital array of the object.

These and other aspects and advantages of the present invention will become more clear after careful consideration is given to the following detailed description of the preferred exemplary embodiments thereof.

BRIEF DESCRIPTION OF THE ACCOMPANYING DRAWINGS

Reference will hereinafter be made to the accompanying drawings, wherein like reference numerals throughout the various FIGURES denote like structural elements, and wherein, FIG. 1 is a schematic representation of a system that may be employed to image object morphology using MRI; and FIG. 2 is a flow chart depicting the data processing that may be employed in accordance with the present invention.

DETAILED DESCRIPTION OF THE INVENTION

Figure 1:
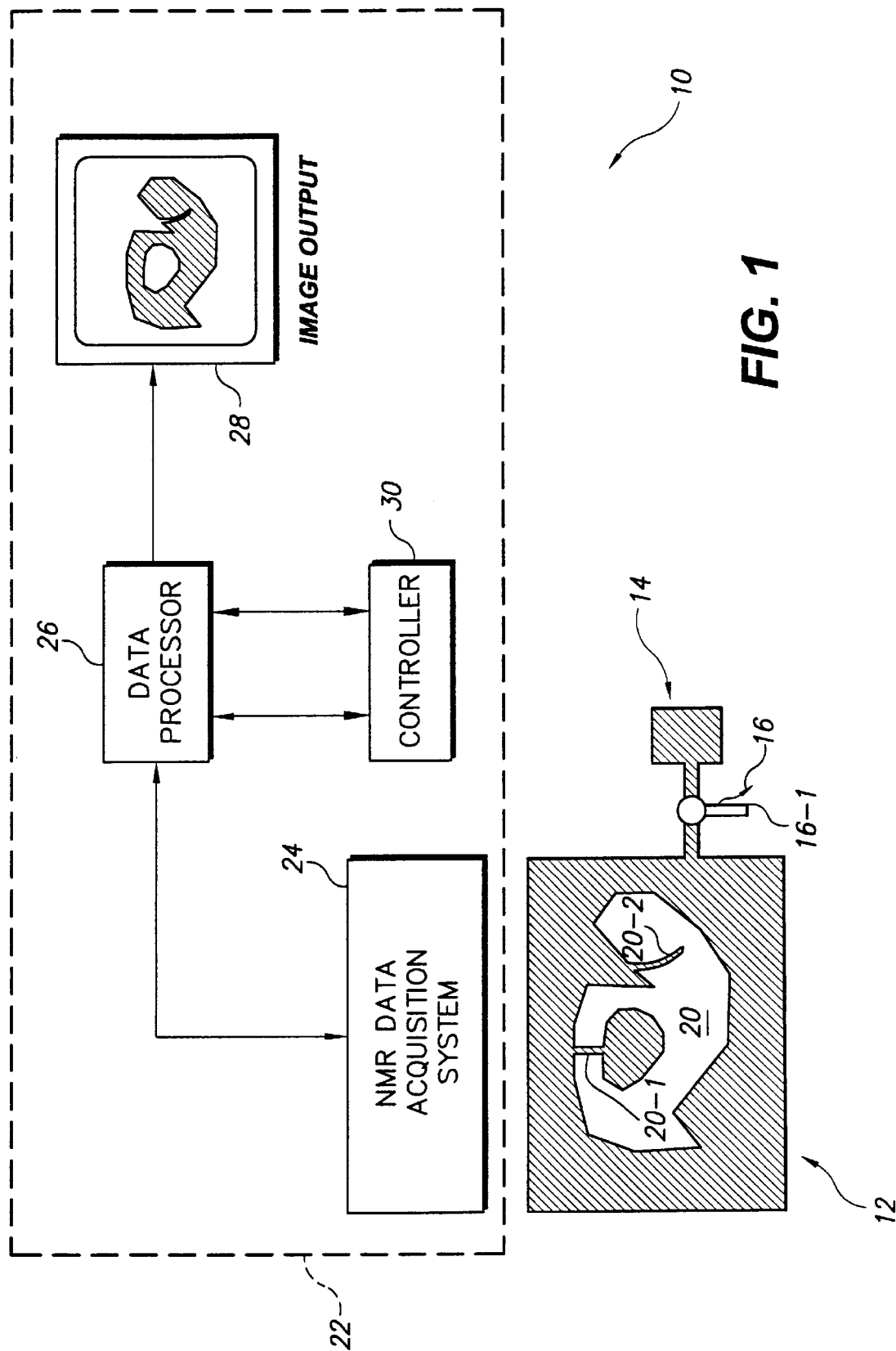

Accompanying FIG. 1 depicts in schematic fashion one possible embodiment of a system 10 in accordance with the present invention. As will be noted, the system 10 includes a sealed vessel 12 in fluid-communication with a reservoir 14 evacuation valve 16. An object 20 to be imaged is placed within the vessel 12, following which the vessel 12 is evacuated through port 16-1 of valve 16 to remove all residual gas therefrom. Once evacuated, the valve 16 is actuated so as to fill the vessel 12 with a suitable imaging fluid from fluid reservoir 14.

The fluid that is employed to fill the vessel 12 is selected from any fluid that will provide a strong signal for magnetic resonance microscopy of magnetic resonance imaging. For example, the imaging fluid may be proton solutions (e.g., $H_2O$, organic solvents, such benzene and the like) doped with relaxation agents (e.g., Gd, Mn or other paramagnetic elements) that will allow image acquisition with short repetition times (TR). Another preferred form of imaging fluid includes hyperpolarized or laser-polarized noble gases, such as Xenon-129 and/or Helium-3. Such hyperpolarized gases may be prepared in accordance with U.S. Pat. No. 5,545,396, the entire content of which is expressly incorporated hereinto by reference. The imaging fluid may be either liquid or gas, and may be contain a further dopant and/or additive, such as surfactants or other chemicals to limit the formation of air bubbles and promote the penetration and filling of the object 20 by the imaging fluid.

The object 20 to be imaged may be preconditioned by the formation of connecting channels 20-1 which fluid-connect internal void spaces with the environment within the vessel 12. Thus, the imaging fluid that fills the vessel 12 will be capable of entering internal void spaces through such channels. In a similar manner, cracks or other like void spaces 20-2 which might exist within the object 20 are filled with the imaging fluid.

With the object 20 immersed within the imaging fluid which fills the container 12, the NMR data acquisition system 24 associated with MRI system 22 may be activated. In this regard, the MRI data acquisition system operates so as to execute a large array that will generate an image of the imaging solution. The data that is acquired is processed by a data processor 26 and outputs signals to an imager 28 representing a visually perceptible image of the object 20. A controller 30 may be employed to control the data acquisition and/or data processing of the system 22.

Figure 2:
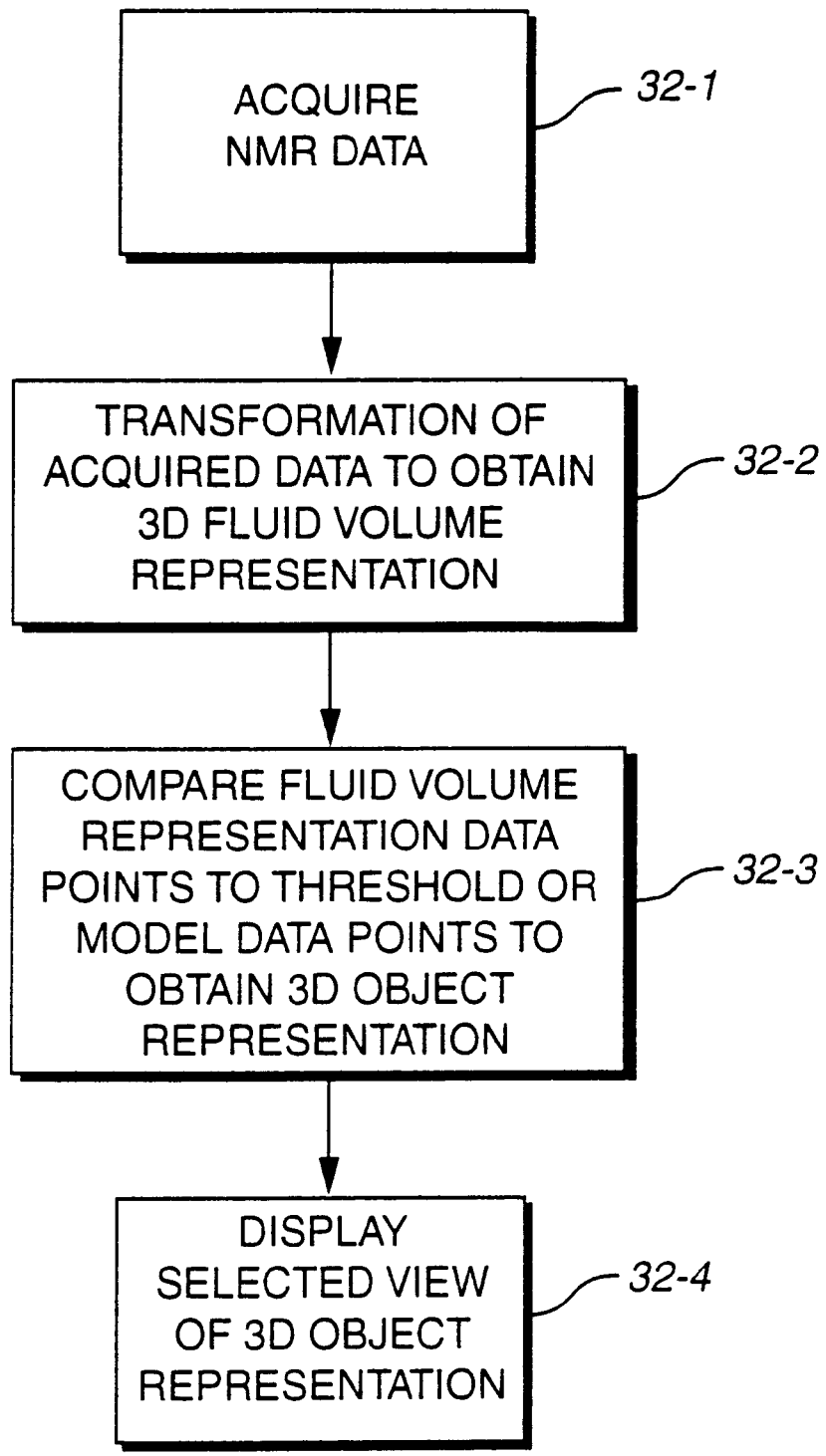

As depicted in FIG. 2, the system 10 in accordance with the present invention acquires NMR data in step 32-1 according to conventional NMR data acquisition techniques. In step 32-2, however, the processor 26 back-transforms the acquired data using conventional transform algorithms to obtain a three-dimensional volume representation of the imaging fluid (i.e., a "negative" image of the object). The fluid volume representation data obtained in step 32-2 is then compared in step 32-3 to threshold or model data points associated with the object to obtain a three-dimensional representation of the object 20 (i.e., a "positive" image of the object). The data may be further processed to remove known defects (e.g., the preconditioned channel 20-1 that was formed in order to allow the imaging fluid to fill the object's internal void space). In step 32-4, the processed data is then output so as to display a selected view of the three-dimensional object representation. In this manner, a "negative" image of object 20 (that is, an image of the surrounding and penetrating fluid which three-dimensionally represents the contours and internal void spaces filled by the fluid) is inverted to a "positive" image representative of the object 20.

The NMR acquisition of data in step 32-1 can occur over a periodic cycle over time. Thus, if the object 20 to be imaged has dynamic components which move throughout the periodic cycle, then the present invention may depict such components at various stages of movement in the cycle. In such a manner, therefore, the imaging techniques of the present invention can present three-dimensional images of a relatively complex moving object throughout its movement cycle.

The particular MRI system 22 that is employed is dependent upon the details of the object 20 intended to be imaged. Thus, for relatively small objects (e.g., objects having a size of less than 10 cm$^3$), a small bore MRI system could be used with a relatively simple imaging fluid, such as $H_2O$ and Gd, so that the fluid yields a strong signal in a relatively short TR. For nondestructive testing and/or determination of small defects in small parts, the imaging solution might be a hyperpolarized gas which yields a very strong signal and would easily penetrate small cracks present in the object to be imaged.

The techniques of this invention are broadly applicable in nondestructive evaluation of both large and small objects, however. In this regard, the present invention is especially well suited to image objects with complicated internal structures. Small defects in the objects to be imaged may also be detected and/or located using the present invention. Data sets obtained from the imaging techniques of this invention may be used to derive accurate morphometric measurements (e.g., distances, areas, and/or volumes). The techniques of the present invention are applicable to laboratory bench-scale analyses as well as in large scale production environments for such things as industrial metrology.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of imaging objects by nuclear magnetic resonance imaging comprising:

(a) immersing an object to be imaged in a nuclear magnetic resonance imaging fluid; and (b) generating an image by nuclear magnetic resonance imaging representative of a spatial distribution of the imaging fluid.

2. The method of claim 1, wherein step (a) is practiced by placing the object within a sealed vessel, and then filling the vessel with the imaging fluid.

3. The method of claim 2, which includes evacuating the sealed vessel prior to filling of the vessel with the imaging fluid.

4. The method of claim 1, which includes fluid-communicating void spaces within the object to be imaged with the imaging fluid.

5. The method of claim 1, wherein step (b) includes forming a three-dimensional array representative of the object.

6. The method of claim 5, which includes acquiring data by nuclear magnetic resonance imaging, transforming the acquired data to obtain a three-dimensional volume representation of the imaging fluid, and then comparing the transformed data points to threshold data points to obtain a three-dimensional representation of the object.

7. The method of claim 1 wherein the imaging fluid is a liquid and/or a gas.

8. The method of claim 7, wherein the imaging fluid is a proton solution.

9. The method of claim 7, wherein the imaging fluid is a hyperpolarized gas.

10. A system for imaging objects by nuclear magnetic resonance imaging comprising:

a sealed container which contains a nuclear magnetic resonance imaging fluid, said container being sized and configured to hold therewithin the object to be imaged immersed in the imaging fluid; and a system for generating an image by nuclear magnetic resonance imaging representative of a spatial distribution of the imaging fluid within the sealed container.

11. The system of claim 10, further comprising a reservoir of said imaging fluid which is fluid connected to said container.

12. The system of claim 10, which includes an evacuation valve for evacuating the container.

13. The system of claim 10, which includes a data processor which generates a back-transformation of nuclear magnetic resonance imaging acquired data to obtain a three-dimensional volume representation of the imaging fluid in which the object is immersed.

14. The system of claim 10, wherein the imaging fluid is a liquid and/or a gas.

15. The system of claim 14, wherein the imaging fluid is a proton solution.

16. The system of claim 14, wherein the imaging fluid is a hyperpolarized gas.

* * * * *